United States Patent
Ayranci et al.

(10) Patent No.: US 12,113,485 B2
(45) Date of Patent: Oct. 8, 2024

(54) STACKED MULTI-STAGE PROGRAMMABLE LNA ARCHITECTURE

(71) Applicant: Murata Manufacturing Co., Ltd., Nagaokakyo (JP)

(72) Inventors: Emre Ayranci, Costa Mesa, CA (US); Miles Sanner, San Diego, CA (US); Mengsheng Rui, San Diego, CA (US); Jubaid Qayyum, San Diego, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 587 days.

(21) Appl. No.: 17/351,131

(22) Filed: Jun. 17, 2021

(65) Prior Publication Data
US 2022/0407469 A1    Dec. 22, 2022

(51) Int. Cl.
*H03F 1/22*        (2006.01)
*H03F 1/02*        (2006.01)
(Continued)

(52) U.S. Cl.
CPC .......... *H03F 1/223* (2013.01); *H03F 1/0233* (2013.01); *H03F 1/26* (2013.01); *H03F 3/195* (2013.01);
(Continued)

(58) Field of Classification Search
CPC ....................................................... H03F 1/22
(Continued)

(56) References Cited

U.S. PATENT DOCUMENTS 6,639,472 B2 * 10/2003 Wilson .................... H03F 3/082
                                                                330/311
6,803,824 B2 * 10/2004 Rategh ................ H03G 1/0029
                                                                330/311
(Continued)

FOREIGN PATENT DOCUMENTS

EP            3621198 A1      3/2020

OTHER PUBLICATIONS

Lee, T.H. The Design of CMOS Radio-Frequency Integrated Circuits, 2nd Edition, Cambridge Univ. Press., 1988, pp. 387-390, 6 pages.

(Continued)

*Primary Examiner* — Henry Choe
(74) *Attorney, Agent, or Firm* — Steinfl + Bruno LLP

(57) ABSTRACT

Methods and devices for reducing DC current consumption of a multi-stage LNA amplifier. According to one aspect, first and second amplification stages are stacked to provide a common conduction path of a DC current. The first stage includes a common-source amplifier, the second stage includes a common-drain amplifier. Coupling between the two stages is provided by series connection of load inductors of the respective stages and a capacitor coupled at a common node between the inductors. According to another aspect, a current splitter circuit is used to split a current to the first stage according to two separate conduction paths, one common path to the two stages, and another separate from the second stage. According to yet another aspect, the current splitter circuit includes a feedback loop that controls the splitting of the current so to maintain a constant current through the common path.

21 Claims, 10 Drawing Sheets

(51) Int. Cl.
*H03F 1/26* (2006.01)
*H03F 3/195* (2006.01)

(52) U.S. Cl.
CPC .. *H03F 2200/294* (2013.01); *H03F 2200/451* (2013.01)

(58) Field of Classification Search
USPC .................................................. 330/311, 310
See application file for complete search history.

(56) References Cited

U.S. PATENT DOCUMENTS

| 10,715,088 | B1* | 7/2020 | Ghanevati | H03F 1/26 |
| 10,951,252 | B2 | 3/2021 | Ayranci et al. | |
| 2006/0261893 | A1 | 11/2006 | Chiang | |
| 2020/0036341 | A1 | 1/2020 | Klaren et al. | |

OTHER PUBLICATIONS

International Search Report and Written Opinion for International PCT Application No. PCT/US2022/031476 filed on May 28, 2022, on behalf of pSemi Corporation. Mail Date: Sep. 5, 2022. 15 Pages.

Schrögendorfer, D., et al., "A 1.2 V, 1-21 0.6-d.B NF, CMOS Low Noise Amplifier with Current-Reuse Broadband Output Stage", 2019 IEEE Asia-Pacific Microwave Conference (APMC), IEEE, Dec. 10, 2019, pp. 225-227, 3 Pages. XP033742133, DOI: 10.1109/APMC46564.2019.9038819.

Schrögendorfer, D., et al., "Analysis and Design of a Broadband Output Stage With Current-Reuse and a Low Insertion-Loss Bypass Mode for CMOS RF Front-End LNAs", IEEE Transactions on Circuits and Systems I: Regular Papers, IEEE, US, vol. 68, No. 5, Apr. 27, 2021, pp. 1800-1813, 14 Pages. XP011850632, ISSN: 1549-8328, DOI: 10.1109/TCSI.2020.3018407.

* cited by examiner

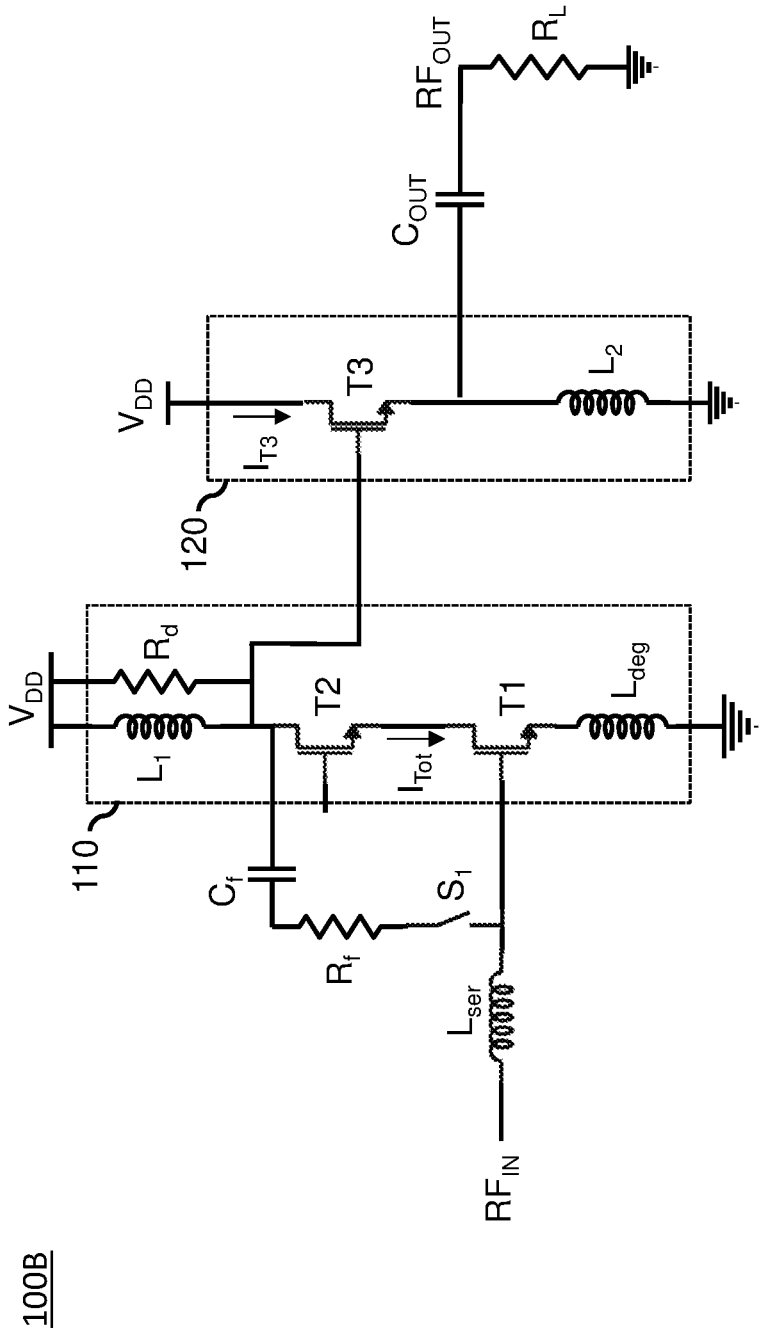
FIG. 1B  *PRIOR ART*

STACKED MULTI-STAGE PROGRAMMABLE LNA ARCHITECTURE

TECHNICAL FIELD

The present disclosure is related to low noise amplifiers (LNAs), and more particularly to methods and apparatus for designing wideband LNAs with different gain modes and reduced power consumption.

BACKGROUND

FIG. 1A shows a prior art (single-stage) low noise amplifier (LNA, 100A) that may be used, for example, in a receiver front-end portion of an RF communication system. The LNA (100A) comprises a stacked transistor amplifying arrangement including an input transistor T1 (configured as a common-source device or amplifier) and a cascode output transistor T2 (configured as a common-gate device or amplifier), an input match circuit (101) coupled to the input transistor T1, and an output match network (102) coupled to the output transistor T2. The input match network (101) may comprise a series connected input inductor ($L_{ser}$) coupled to a gate of the input transistor T1, and a degenerative inductor ($L_{deg}$) coupled to a source of the common-source input transistor T1. It should be noted that the input match circuit (101) may include other elements, such as, for example, a series capacitor and/or a shunting inductor coupled between RF input, $RF_{IN}$, and reference ground (e.g., per FIG. 2 later described). The output match network (102) may comprise an inductor ($L_1$) in parallel connection with a resistor ($R_d$), and a capacitor ($C_{match}$), the output match network (102) providing an impedance match to a load $R_L$. The resistor ($R_d$) may be used for deQing the output match network (102) to provide a wideband mode of operation of the LNA (100A). Such deQing of the output match network (102) may result in a lower gain of the LNA (100A), thereby potentially impacting the overall system performance of the receiver.

FIG. 1B shows a prior art multi-stage LNA amplifier (100B), including a first stage (110) that is based on the single-stage cascode configuration (100A) of FIG. 1A, and a second stage (120), that in combination can provide an increased performance for wideband operation. The multi-stage LNA amplifier (100B) comprises a feedback resistor and capacitor, $R_f$ and $C_f$, that can be selectively switched in (or out) the first stage (110) by closing (or opening) a series-connected switch, $S_1$. When switched in, the feedback resistor $R_f$ provides a feedback path between an output of a first stage (110) of the multi-stage LNA amplifier (100B) and an input of the first stage (110), thereby increasing the bandwidth of the first stage (110). The capacitor $C_f$ serves as a DC de-coupling capacitor between the drain of T2 and the gate of T1, but may also be used as part of the tuning of the feedback circuit. Because an output impedance of the first stage (110) may be different for each state of the switch $S_1$, output matching to the load $R_L$ is now achieved by using a second stage (120) that is cascaded to the first stage (110). As can be seen in FIG. 1B, the second stage (120) may be a source follower circuit (120) that includes a transistor, T3, and an inductor ($L_2$) coupled to a source of the transistor T3. As known to a person skilled in the art, an output impedance of the source follower (seen into the source of the transistor T3) is equal to $1/g_m$ where $g_m$ represents the transconductance of the transistor T3. Because such transconductance is practically frequency independent, it can therefore provide an improved output matching for wideband operation and irrespective of the configuration/state of the switch $S_1$. It should be noted that as shown in FIG. 1B, a capacitor, $C_{OUT}$, may be coupled between an output of the source follower circuit (120, source of T3) and the load $R_L$, mainly to block a DC voltage present at the output of the source follower circuit (120). In other words, and in contrast to the capacitor $C_{match}$ of the configuration (100A) of FIG. 1A, the capacitor $C_{OUT}$ may not be used for matching purposes.

Although the prior art configuration shown in FIG. 1B may provide an improved (RF) performance for wideband operation, such increase in performance may come at a cost of increased power usage, since as shown in FIG. 1B, the first stage (110) and the second stage (120) operate from different bias currents, $I_{Tot}$ and $I_{T3}$. In portable/handheld applications where the power supply (e.g., supply voltage $V_{DD}$) is provided by a battery, longevity of operation in between recharges of the battery becomes important, and therefore, operation according to the configuration of FIG. 1A or FIG. 1B may be considered as a tradeoff between increased wideband performance (at a cost of increased power usage) and decreased power usage (at a cost of decreased wideband performance).

Teachings according to the present disclosure overcome the above described shortcomings of the prior art via a multi-stage LNA configuration that provides a wideband performance similar to the prior art configuration of FIG. 1B while consuming a reduced power that is comparable to, or less than, one of the prior art configuration of FIG. 1A. Furthermore, stages of the multi-stage LNA configuration according to the present disclosure may be selectively switched in or out for operation according to different performance metrics that may take into consideration, not only tradeoffs among gain (flatness), noise figure, linearity and output matching, but also current distribution among different stages.

SUMMARY

According to a first aspect of the present disclosure, a stacked multi-stage low noise amplifier (LNA) circuit is presented, comprising: a first amplification stage comprising a common-source amplifier coupled between a common node and a reference ground, the first amplification stage configured to receive an input radio frequency (RF) signal and generate therefrom a first stage amplified RF signal; a second amplification stage comprising a common-drain amplifier coupled between a supply voltage and the common node, the second amplification stage configured to receive the first stage amplified RF signal and generate therefrom an output RF signal to a load; and a shunting capacitor coupled to the common node, the shunting capacitor configured to short the common node to the reference ground at frequencies of operation of the first and second amplification stages.

According to a second aspect of the present disclosure, a method for reducing DC current consumption in a multi-stage low noise amplifier (LNA) is presented, the method comprising: providing a first amplification stage comprising a common-source amplifier coupled between a common node and a reference ground; providing a second amplification stage comprising a common-drain amplifier coupled between a supply voltage and the common node; coupling the common node to a shunting capacitor thereby shorting the common node at frequencies of operation of the first and second amplification stages; based on the providing and the providing, conducting a first DC current from the supply voltage through the first amplification stage and the second amplification stage, thereby reducing DC current consumption of the multi-stage LNA.

Further aspects of the disclosure are provided in the description, drawings and claims of the present application.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1B shows a simplified schematic of a multi-stage prior art low noise amplifier (LNA) with improved wideband performance.

Like reference numbers and designations in the various drawings indicate like elements.

DETAILED DESCRIPTION

Figure 1A:
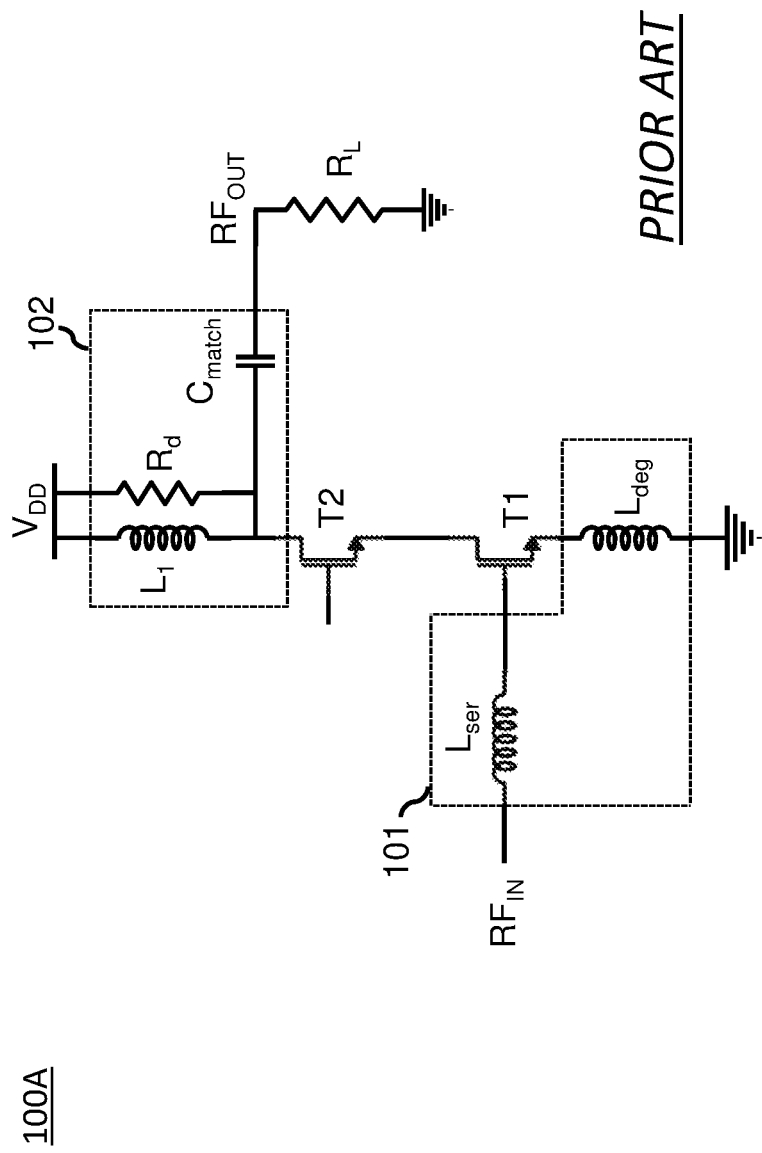
FIG. 1A shows a simplified schematic of a single stage prior art low noise amplifier (LNA).

As known in the art, in RF systems (e.g., an RF amplifier) bandwidth is sometimes defined in terms of percentage bandwidth, which is defined as the ratio (in percentage) of the absolute bandwidth to the center frequency at which such RF systems operate. One performance metric of RF amplifiers associated with the bandwidth is represented by gain flatness over the specified bandwidth. Gain flatness is typically specified in dB, indicating the gain variation over the frequency range of operation.

Throughout the present disclosure, the term "Narrowband" may be used to describe applications where the frequency range of operation represents a percentage bandwidth of less than 7.5%; the term "Extended Narrowband" may be used to describe applications where the frequency range of operation represents a percentage bandwidth between 7.5% and 15%; and the term "Wideband" may be used to describe applications where the frequency range of operation represents a percentage bandwidth more than 15%.

Throughout the present disclosure, the expressions "common-source amplifier", "common-drain amplifier" and "common-gate amplifier" refer to the well-known in the art three basic single-stage field-effect transistor (FET) topologies. For example, the common-source amplifier may be used as a voltage or transconductance amplifier; the common-drain amplifier, also known as a "source follower", may be used as a voltage buffer; and the common-gate amplifier may be used as current buffer or voltage amplifier. As it is well known in the art, an output of a common-source amplifier may be coupled to one or more series connected common-gate amplifiers according to a cascode configuration (e.g., first stage 110 of FIG. 2 later described).

Teachings according to the present disclosure allow reduction in power (e.g., current) consumption via a novel multi-stage LNA configuration using a stacked topology of two amplification stages. Such stacked multi-stage topology, also referred to herein as, stacked multi-stage LNA amplifier, stacked multi-stage configuration, or stacked multi-stage LNA, may provide a common DC current conduction path to the stacked amplification stages thereby reducing DC current consumption.

In cases where different DC biasing currents for each of the two stacked amplification stages are desired, teachings according to the present disclosure provide for a current splitter circuit that can split a conduction path of the DC current from the power supply to two separate conduction paths, one that is common to both amplification stages and the other that is provided to one of the two stages.

According to an embodiment of the present disclosure, the current splitter circuit may control the splitting of the DC current to provide and maintain a fixed/constant DC current through the common conduction path irrespective of a total DC current from the power supply to the stacked multi-stage LNA. For example, a first stage of the two stacked amplification stages may control the total DC current from the power supply; the current splitter may route a portion of the total DC current to the conduction path that is common to the first stage and a second stage; and route a remaining portion to a conduction path that only passes through the first stage. In other words, the current splitter allows operation of the two stacked amplification stages according to different DC currents, a common DC current conducted through the common DC current conduction path for biasing of one of the two amplification stages, and a combined DC current generated by a combination (e.g., sum) of the common DC current and a split DC current for biasing of the other amplification stage.

According to an embodiment of the present disclosure, the current splitter circuit may include a feedback loop to control a current through the common conduction path. In other words, the feedback loop is configured to control the splitting of the total DC current from the power supply to a fixed DC current for biasing of the second stage, and a remaining current that in combination with the fixed DC current biases the first stage. Accordingly, the first stage may control the total DC current from the power supply, and the current splitter circuit may control the DC current to the second stage. In other words, the total DC current from the power supply may first be split by the current splitter circuit to generate the DC current for biasing of the second stage, and then be generated by recombining a split DC current with the second stage DC current for biasing of the first stage.

According to an embodiment of the present disclosure, control of the DC current to the second stage may be based on sensing of a biasing point in the second stage, and using such biasing point as a feedback to the feedback loop of the current splitter circuit. According to an exemplary embodiment of the present disclosure, the biasing point may be a voltage representative of a magnitude of a DC current that flows through the second stage.

According to an embodiment of the present disclosure, the first amplification stage includes a common-source amplifier circuit. According to an exemplary embodiment of the present disclosure, the common-source amplifier circuit includes a common-source transistor. According to an exemplary embodiment of the present disclosure, an amplified RF signal from the first amplification stage may be output at a drain of the common-source transistor and fed to the second amplification stage.

According to an exemplary embodiment of the present disclosure, the common-source transistor may be an input stage/transistor of a stacked transistor amplifier including one or more cascode transistors in series connection with the input stage/transistor. According to an exemplary embodiment of the present disclosure, an amplified RF signal from the first amplification stage may be output at a drain of an output cascode transistor and fed to the second amplification stage.

According to an embodiment of the present disclosure, the first amplification stage operates between a DC voltage provided through an inductor (e.g., load inductor) that is coupled (e.g., connected) to an output of the first amplification stage, and a reference ground coupled (e.g., connected) to a source of the common-source transistor.

According to an embodiment of the present disclosure, the second amplification stage includes a common-drain amplifier circuit arranged as a source follower circuit. According to an embodiment of the present disclosure, the source follower circuit includes a common-drain transistor and an inductor coupled (e.g., connected) to the source of the transistor. The source follower circuit may provide a wideband matching to a load for output of an RF signal amplified by the first stage and buffered by the second stage.

According to an embodiment of the present disclosure, stacking of the second stage to the first stage is provided at an AC ground node that is common to the first and second stages. According to an embodiment of the present disclosure, the AC ground node is provided at a common node that couples (e.g., connects) the load inductor of the first stage to the (second stage) source follower inductor. According to an embodiment of the present disclosure, a bypass capacitor is coupled to the AC ground node so to reduce any AC signal through the load inductor and/or the source follower inductor. Such bypass capacitor essentially providing an ideal AC ground at the AC ground node, thereby allowing high gain operation of the multi-stage LNA as well as high isolation between the first and the second stage. In other words, RF performance, including gain and bandwidth, of one stage is essentially independent from the RF performance of the other stage.

According to an embodiment of the present disclosure, a plurality of switches may be included in the multi-stage LNA configuration so to selectively provide amplification through both stages, or through the first stage only, while reducing power consumption by eliminating current conduction paths in unused circuits/elements. Amplification through both stages may be selected for high gain and/or wideband modes of operation, and amplification through only the first stage may be selected for a low gain mode of operation. According to an exemplary embodiment of the present disclosure, low gain mode of operation may include a wideband mode of operation via selective coupling of a feedback resistor between the output and input of the first stage. Other aspects of the present disclosure may be provided with reference to the various figures described below.

Figure 2:
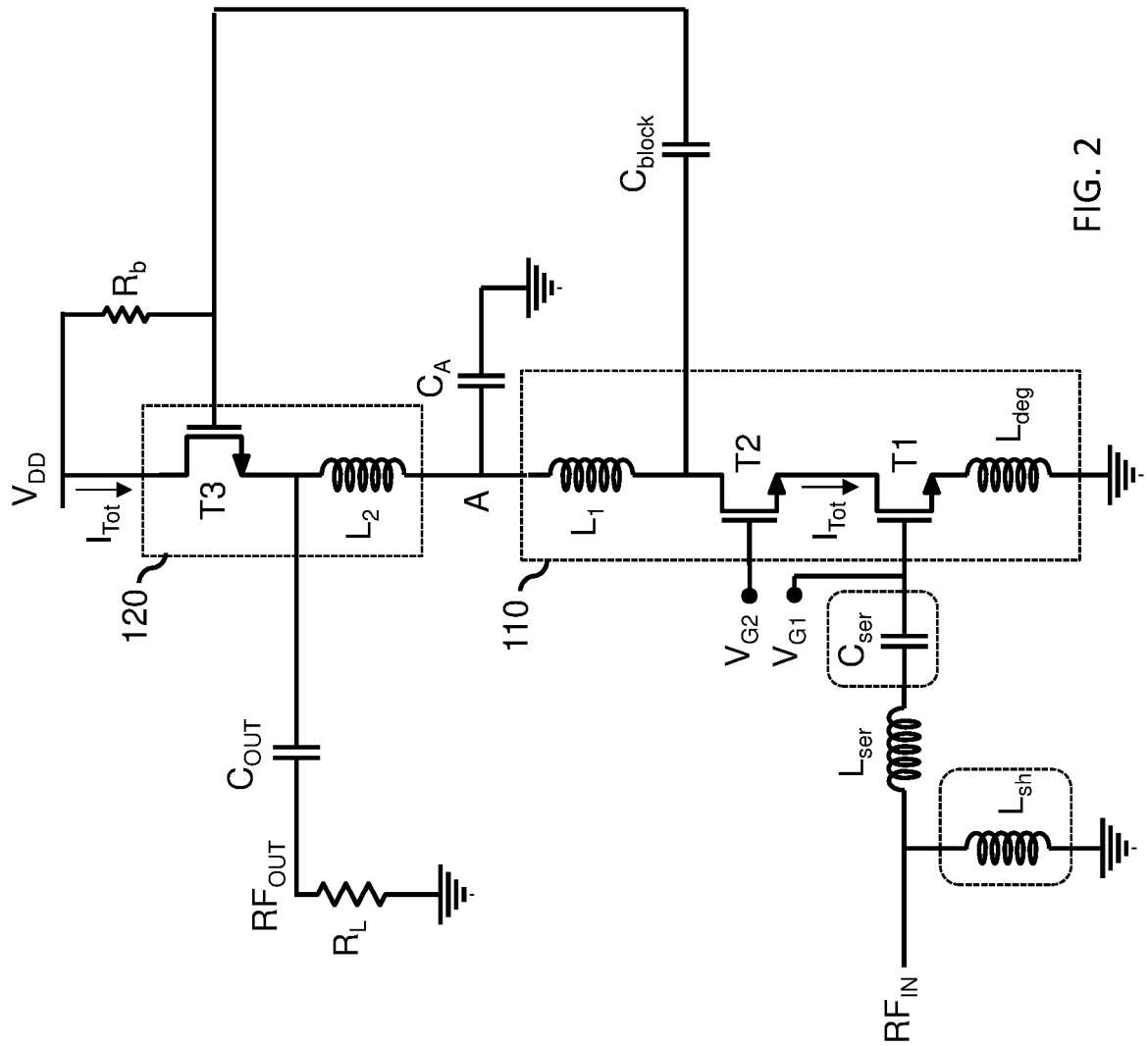
FIG. 2 shows a simplified schematic of a multi-stage low noise amplifier (LNA) according to an embodiment of the present disclosure, wherein a first stage and a second stage are provided with a same bias current.

FIG. 2 shows a simplified schematic of a stacked multi-stage low noise amplifier (LNA, 200) according to an embodiment of the present disclosure, wherein a first stage (110) and a second stage (120) can be likened to the first stage (110) and second stage (120) described above with reference to FIG. 1B. However, in contrast to the cascaded configuration shown in FIG. 1B wherein each stage is biased via a different/separate DC bias current, the stacked configuration of FIG. 2 allows the first stage (110) and the second stage (120) to operate from a same DC bias current, $I_{Tot}$.

An input RF signal, $RF_{IN}$, provided to the multi-stage LNA (200) of FIG. 2 is amplified via the first stage (110), buffered by the second stage (120), and output as $RF_{OUT}$ to the load $R_L$. A DC blocking capacitor, $C_{block}$, decouples DC levels of the two stages (110, 120) while providing AC coupling between the two stages. Likewise, a DC blocking capacitor, $C_{OUT}$, decouples DC level at the output of the second stage (120) from a DC level at the load, $R_L$; A capacitor, $C_{ser}$, coupled to an input of the first stage (110) may be used to decouple DC level at the input of the first stage (110) from a circuit used to provide the input RF signal, $RF_{IN}$, to the multi-stage LNA (200). In some embodiments, the capacitor, $C_{ser}$, may also be used for input match of the first stage (110), in combination with, for example, series connected inductor, $L_{ser}$, shunting inductor, $L_{sh}$, and/or degeneration inductor, $L_{deg}$.

With continued reference to FIG. 2, stacking of the second stage (120) to the first stage (110) is provided at an AC ground node, A, that is common to the first and second stages (110, 120). As shown in FIG. 2, the AC ground node, A, is a common node that couples (e.g., connects) the load inductor, $L_1$, of the first stage (110) to the load inductor, $L_2$, of the second stage (120). A bypass capacitor, $C_A$, is coupled to the AC ground node, A, so to reduce any AC signal through the first stage load inductor, $L_1$, and/or through the second stage (source follower) load inductor, $L_2$. The bypass capacitor, $C_A$, essentially providing an ideal AC ground at the AC ground node, A, thereby allowing high gain operation of the multi-stage LNA (200) as well as high isolation between the first stage (110) and the second stage (120). According to an embodiment of the present disclosure, a capacitance of the bypass capacitor, $C_A$, may be selected in view of frequencies of operation of the stacked multi-stage LNA (200), such as to produce an AC short at the frequencies of operation.

The stacked multi-stage LNA (200) of FIG. 2 includes a common DC current conduction path for provision of a same DC biasing current, $I_{Tot}$, to the first stage (110) and to the second stage (120). As shown in FIG. 2, such common DC current conduction path conducts the DC biasing current, $I_{Tot}$, from the (power) supply voltage, $V_{DD}$, through: the drain and source of the transistor, T3, of the second stage (120); the load inductor, $L_2$, of the second stage; the load inductor, $L_1$, of the first stage (110); drains and sources of respective transistors T2 and T1 of the first stage (110); and the degeneration inductor, $L_{deg}$, of the first stage (110) to the reference ground. Accordingly, the DC biasing current, $I_{Tot}$, which may be a demand current based on, for example, a gate biasing voltage, $V_{G1}$, to the input transistor, T1, of the first stage (110), flows through the first stage (110) and the second stage (120). It should be noted that the first stage (110) may include the (common-source) input transistor, T1, and one or more cascode transistors (T2, . . . ), a number of the one or more cascode transistors being based on, for example, a level of the supply voltage, $V_{DD}$, and a voltage withstand capability of the transistors of the first stage (110). Accordingly, the single cascode transistor, T2, shown in the exemplary first stage (110) of FIG. 2 should not be considered as limiting the scope of the present invention. Furthermore, DC voltage biasing of the cascode transistors (e.g., T2) of the first stage (110) via gate voltage (e.g., $V_{G2}$) may be provided in view of a desired distribution of the supply voltage, $V_{DD}$, across the transistors of the first stage (110), while taking into account, for example, a voltage drop across the second stage (120).

With continued reference to FIG. 2, according to an embodiment of the present disclosure, biasing of the gate of the source follower circuit (120) may be provided via a pull up resistor $R_b$ coupled between the supply voltage, $V_{DD}$, and the gate of the source follower transistor, T3. Accordingly, and since the source of the transistor T3 is floating (e.g., not DC coupled), a change in the DC bias current, $I_{Tot}$, (e.g., per $V_{G1}$ biasing) may cause a change in a (DC) voltage at the source of the transistor T3 (and therefore the drain-to-source voltage) for conduction of a changed DC bias current. In turn, such change of the source voltage of the transistor T3 may cause a change in a DC voltage at the AC ground node, A. In some applications it may be desirable to maintain biasing points of the transistor T3 fixed while the demand DC current for the first stage (110) changes. This can allow to maintain a same (constant) value of the transconductance of the source follower circuit (120) for a more consistent (e.g., increased) matching to the load, $R_L$. It follows that according to an embodiment of the present disclosure, shown in FIG. 3A, biasing points of the transistor T3 are maintained fixed irrespective of a DC bias current (e.g., $I_{Tot}$) demanded by the first stage (110).

Figure 3A:
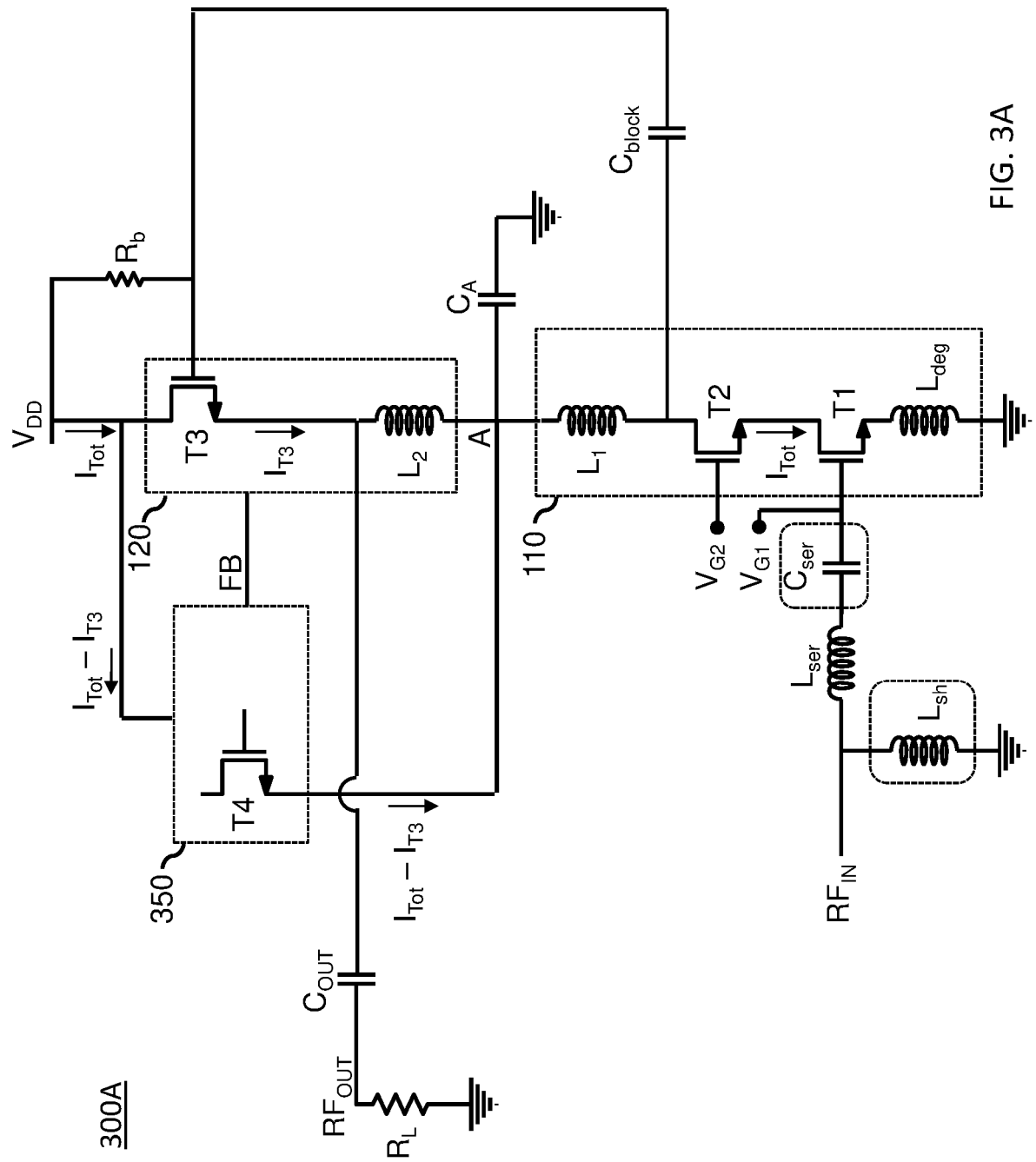
FIG. 3A shows a simplified schematic of a multi-stage low noise amplifier (LNA) according to another embodiment of the present disclosure, wherein a portion of a bias current to a first stage is shared with a second stage via a current splitter circuit.

FIG. 3A shows a simplified schematic of a multi-stage low noise amplifier (LNA, 300A) according to another embodiment of the present disclosure, wherein a portion, $I_{T3}$, of a bias current, $I_{Tot}$, to the first stage (110) is shared with the second stage (120) via a current splitter circuit (350). In other words, the DC bias current that is conducted through the common DC current conduction path provided by the stacked configuration of the first and second stages (110, 120), represents a desired fixed/constant DC biasing current, $I_{T3}$, of the second stage (120). As described above with reference to, for example, FIG. 2, the DC biasing current, $I_{T3}$, may be based on a desired transconductance of the source follower circuit (120) to provide a desired matching to the load, $R_L$.

With continued reference to FIG. 3A, according to an embodiment of the present disclosure, a current splitter circuit (350) splits the total current, $I_{Tot}$, to a first portion current, $I_{Tot}-I_{T3}$, and a second portion current, $I_{T3}$, wherein the second portion current, $I_{T3}$, represents the (fixed) DC biasing current, $I_{T3}$, of the second stage (120) and the first portion current, $I_{Tot}-I_{T3}$, represents the balance between the (demanded) DC biasing current, $I_{Tot}$, of the first stage (110) and the DC biasing current, $I_{T3}$, of the second stage (120). According to an embodiment of the present disclosure, the current splitter circuit (350) may be coupled between the supply voltage, $V_{DD}$, and the AC ground node, A, thereby providing a current conduction path between the supply voltage, $V_{DD}$, and the AC ground node, A, that is different and separate from (e.g., parallel to) the current conduction path provided by the second stage (120). In other words, as can be clearly taken from FIG. 3A, the two split currents, $I_{T3}$, and, $I_{Tot}-I_{T3}$, follow different and separate conduction paths to combine at the AC ground node, A, thereby providing the DC biasing current, $I_{Tot}$, to the first stage (110).

According to an embodiment of the present disclosure, the current splitter circuit (350) may maintain the second portion current, $I_{T3}$, fixed/constant via a feedback loop that monitors one or more biasing points of the second stage (120), including a DC voltage and/or a DC current. This is exemplified in FIG. 3A via a feedback control signal, FB, from the second stage (120) to the current splitter circuit (350). According to an embodiment of the present disclosure, the current splitter circuit (350) includes a transistor, T4, whose biasing is controlled to conduct the first portion current, $I_{Tot}-I_{T3}$, based on the feedback control signal, FB. In other words, a drain-to-source current of the transistor, T4, is controlled based on the feedback control signal, FB, to provide the balance, $I_{Tot}-I_{T3}$, between the (demanded) DC biasing current, $I_{Tot}$, of the first stage (110) and the (fixed) DC biasing current, $I_{T3}$, of the second stage (120). According to an exemplary embodiment of the present disclosure, a drain of the transistor T4 may be coupled (e.g., connected) to the supply voltage, $V_{DD}$, and a source of the transistor T4 may be coupled (e.g., connected) to the AC ground node, A.

Figure 3B:
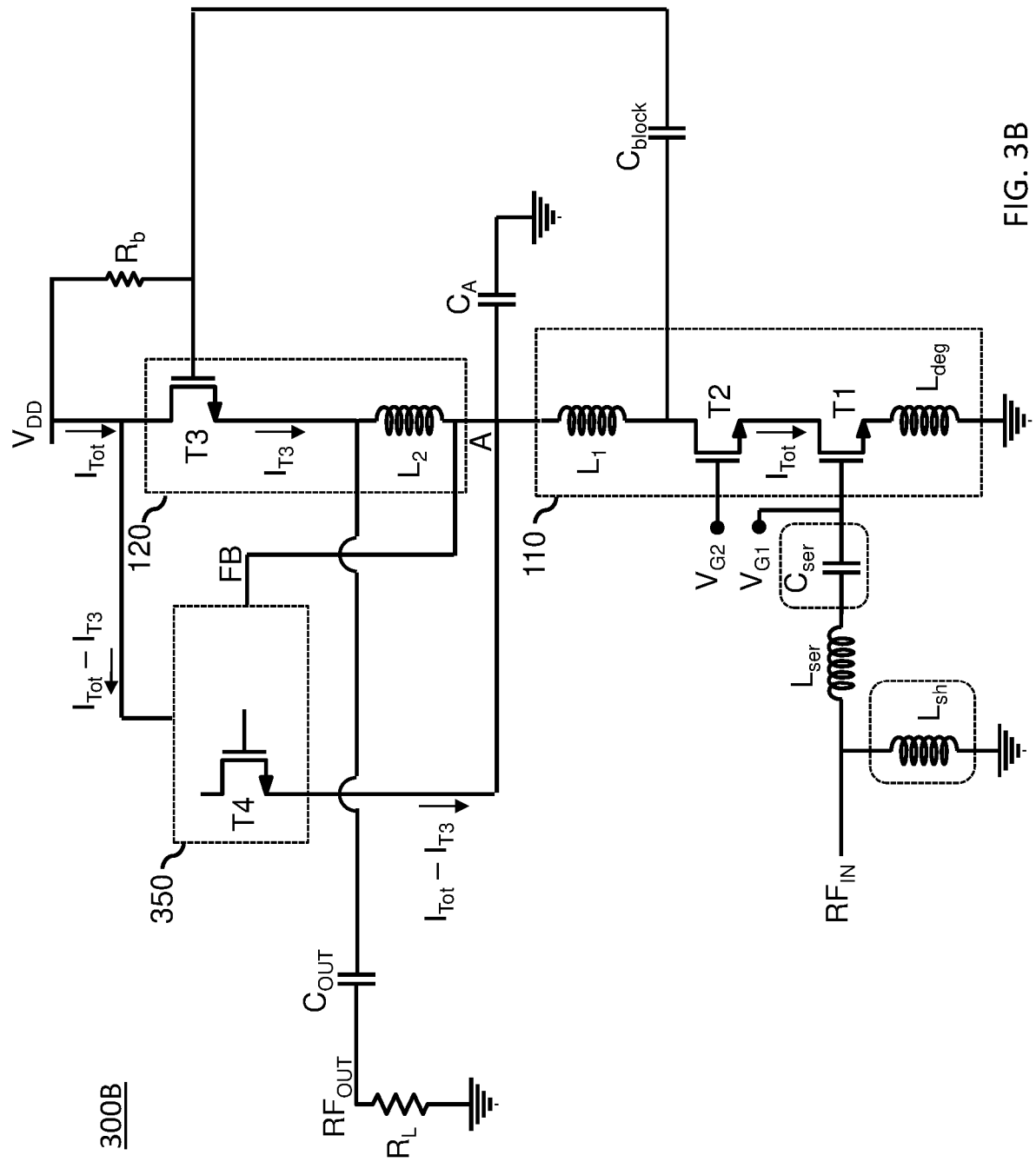
FIG. 3B shows an exemplary embodiment according to the present disclosure of a feedback control signal used in the current splitter circuit shown in FIG. 3A.

FIG. 3B shows an exemplary embodiment according to the present disclosure of the configuration described above with reference to FIG. 3A wherein the feedback control signal, FB, to the current splitter circuit (350) is provided at the AC ground node, A. In the configuration (300B) of FIG. 3B, the current splitter circuit (350) may sense a DC voltage at the AC ground node, A, and control the biasing of the transistor, T4, to output the current, $I_{Tot}-I_{T3}$. According to an embodiment of the present disclosure, the current splitter circuit (350) may further control, based on the sensed DC voltage at the AC ground node, A, the voltage at the same node, A. Since the voltage at the AC ground node, A, determines the DC voltage at the source of the transistor, T3, and since the gate and drain of the transistor T3 are DC biased (e.g., via $V_{DD}$ and $R_b$), the voltage at the AC ground node, A, controls (e.g., limits) the (drain-to-source) current, $I_{T3}$, through the second stage (120). Therefore, the feedback loop of the current splitter circuit (350) may control a voltage at the AC ground node, A, to bias the transistor, T3, for a desired current, $I_{T3}$, while controlling the biasing of the transistor, T4, to output the current, $I_{Tot}-I_{T3}$. An exemplary embodiment of the current splitter circuit (350) and associated feedback loop is shown in FIG. 3C.

Figure 3C:
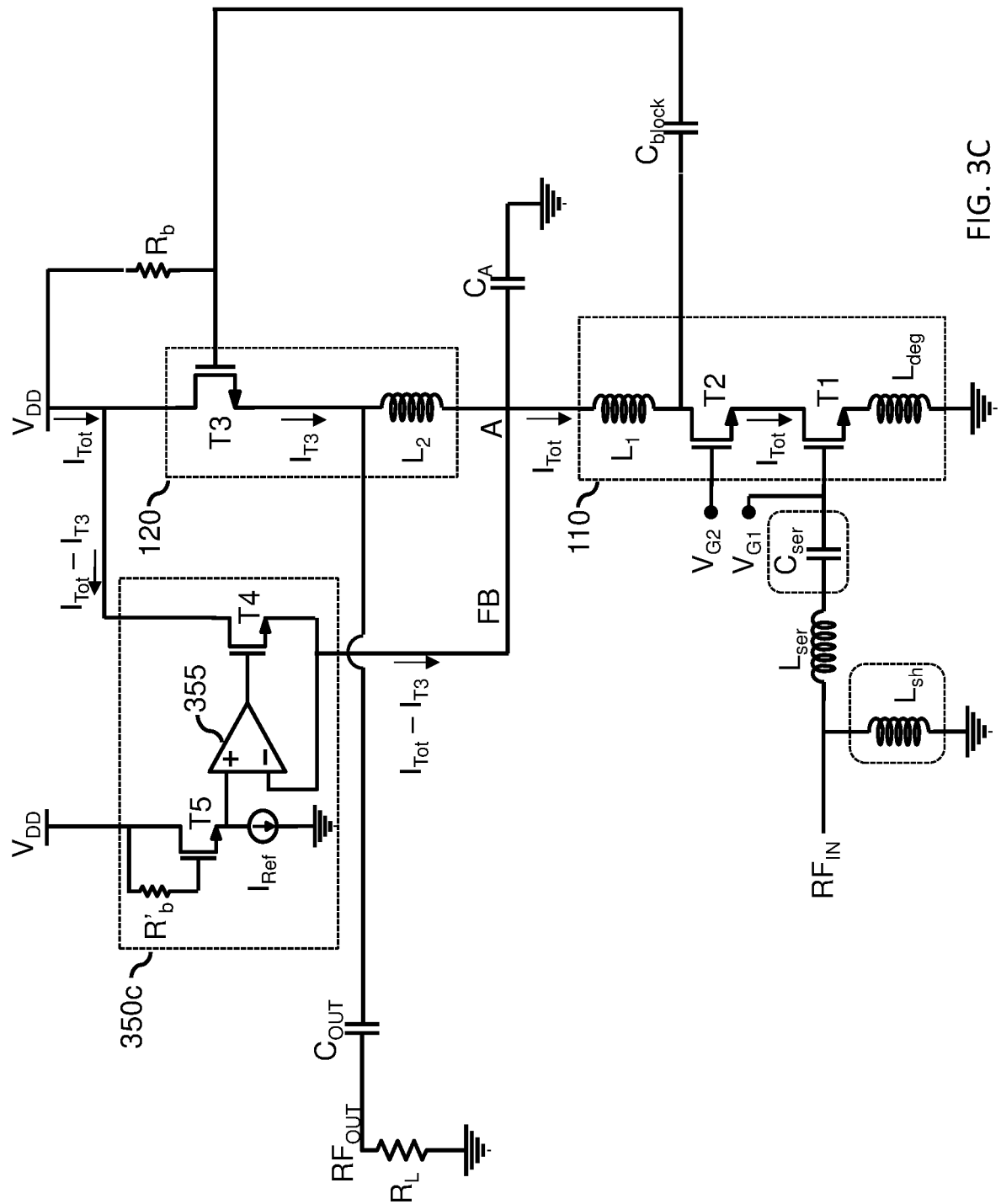
FIG. 3C shows an exemplary embodiment according to the present disclosure of the current splitter circuit shown in FIG. 3B.

FIG. 3C shows an exemplary embodiment according to the present disclosure of a current splitter circuit (350c) that may be used as the current splitter circuit (350) described above with reference to FIG. 3B. As shown in FIG. 3C, the current splitter circuit (350c) may include an operational amplifier (355) having an output coupled (connected) to the gate of the transistor T4, a positive input (labeled as +) coupled to a source of a transistor T5, and a negative input (labeled as −) coupled to the source of the transistor T4 and to the AC ground node, A. Drains of the transistors T4 and T5 are coupled to the supply voltage, $V_{DD}$. A gate voltage to the transistor T5 is provided via a gate biasing resistor, $R'_b$, coupled between the supply voltage, $V_{DD}$, and the gate of the transistor T5. A reference current source, $I_{Ref}$, is coupled between the source of the transistor T5 and the reference ground.

With continued reference to the current splitter circuit (350c) of FIG. 3C, the reference current source, $I_{Ref}$, establishes the drain-to-source current through the transistor T5, which in combination with the gate biasing voltage established via the gate biasing resistor, $R'_b$, establish a voltage at the source of the transistor T5. In other words, for a gate biasing voltage provided by the gate biasing resistor, $R'_b$, the voltage at the source of the transistor T5 settles to a value that corresponds to a gate-to-source voltage of the transistor T5 for conduction of a drain-to-source current equal to $I_{Ref}$. Furthermore, the combination of the operational amplifier (355) and the transistor T4 provide a feedback loop (355, T4) that forces a voltage at the AC ground node, A, to be equal to the voltage at the source of the transistor T5. Accordingly, the feedback loop (355, T4) controls a gate voltage to the transistor T4 to maintain the transistor T4 in conduction while forcing the voltage at the AC ground node, A, to be equal to the voltage at the source of the transistor T5. According to an embodiment of the present disclosure, a size of the transistor T4 may be chosen to provide all the necessary (balance) current, $I_{Tot}-I_{T3}$, requested by the first stage (110) while under control (e.g., gate and drain of T4) of the feedback loop (355, T4).

According to an embodiment of the present disclosure, the circuit (T5, $R'_b$) may be selected to be a replica of the circuit (T3, $R_b$). Accordingly, by forcing the voltage at the AC ground node, A, to be equal to the voltage at the source of the (replica) transistor T5, the current, $I_{T3}$, through the transistor T3 becomes a scaled version of the current $I_{Ref}$, scaling being based on a scaling (factor) of the replica circuit (T3, $R_b$). For example, if the replica circuit (T5, $R'_b$) is a factor 1/N (e.g., N can be any positive number, including integer or rational) of the circuit (T3, $R_b$), then the current $I_{T3}$, is equal to $N \times I_{Ref}$. As known to a person skilled in the art, scaling of the (replica) transistor T5 may be provided via a size of the transistor, including, for example, a width and/or a length of the transistor.

Figure 4:
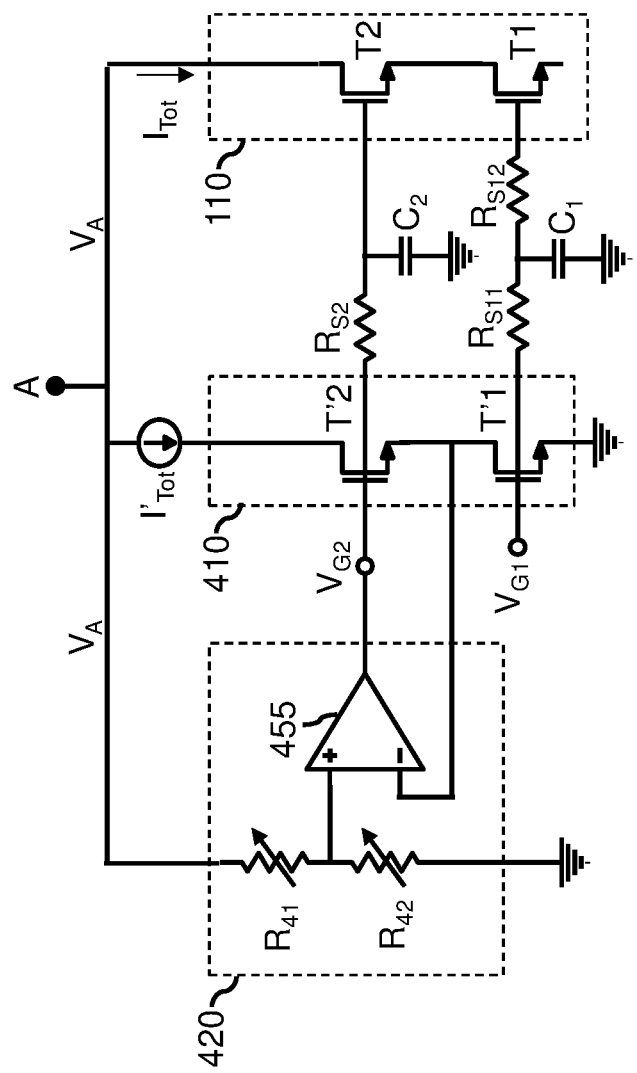
FIG. 4 shows a simplified schematic of an exemplary biasing circuit used to bias the multi-stage low noise amplifier (LNA) of any one of FIG. 2, 3A, 3B or 3C.

FIG. 4 shows a simplified schematic of an exemplary biasing circuit (410, 420, $I'_{Tot}$) used to bias the multi-stage low noise amplifier (LNA) described above with reference to any one of FIG. 2, 3A, 3B or 3C. In particular, the exemplary biasing circuit of FIG. 4 may be used to generate gate biasing voltages (e.g., $V_{G1}$, $V_{G2}$, ..., etc.) to the transistors (e.g., T1, T2, ..., etc.) of the first stage (110). According to an embodiment of the present disclosure, the biasing circuit includes a replica circuit (410, T'1, T'2, ..., etc.) of the transistors (e.g., T1, T2, ..., etc.) that is coupled to gates of transistors (e.g., T1, T2, ..., etc.) of the first stage (110). Accordingly, by forcing a DC current (e.g., via a current source $I'_{Tot}$) through the replica circuit (410), a corresponding scaled DC current, $I_{Tot}$, flows through the first stage (110). As shown in FIG. 4, coupling between the gates of the replica circuit (410) and of the first stage (110) may be provided via (series connected) resistors (e.g., $R_{S11}$, $R_{S12}$, and $R_{S2}$). Values of such resistors in combination with respective gate capacitors (e.g., $C_1$, $C_2$) may be used to provide filtering to isolate the biasing circuit (410, 420, $I'_{Tot}$) from RF components of the first stage (110).

With continued reference to FIG. 4, a gate biasing voltage, $V_{G2}$, to the cascode transistor T2 of the first stage (110) and to the respective cascode transistor T'2 of the replica circuit (410) may be provided via a feedback circuit (420) that is configured to track a change in a voltage, $V_A$, at the AC ground node, A, described above with reference to FIG. 2, 3A, 3B or 3C. By forcing a voltage at a source of the transistor T'2 to follow/track a change in the voltage, $V_A$, a drain-to-source voltage of the cascode transistor T'2, and therefore of the cascode transistor T2, is maintained. This in turn can allow a sufficiently high drain-to-source voltage headroom for operation of the cascode transistor T2 for low voltage levels of $V_A$. It should be noted that although the gate biasing voltage $V_{G2}$ shown in FIG. 4 is generated via tracking of the voltage, $V_A$, at the AC ground node, A, tracking with respect to the supply voltage, $V_{DD}$, may also be possible. In this case, the feedback circuit (420), as well as the replica circuit (410), may be coupled to $V_{DD}$ instead of $V_A$.

With further reference to FIG. 4, the feedback circuit (420) may include an operational amplifier (455) having an output that is coupled to the gate of the transistor T'2, a positive input that is coupled to a common node of a resistive voltage divider ($R_{41}$, $R_{42}$), and a negative input that is coupled to the source of the transistor T'2. Accordingly, the operational amplifier (455) forces the voltage at the source of the transistor T'2 to be equal to the divided voltage at the common node of the resistive voltage divider ($R_{41}$, $R_{42}$). Since the resistive voltage divider ($R_{41}$, $R_{42}$) is coupled between the voltage, $V_A$, at the AC ground node, A, then the common node of the resistive voltage divider ($R_{41}$, $R_{42}$) that is coupled to the positive input of the operational amplifier (455) also tracks the voltage, $V_A$.

With reference back to FIGS. 3A-3C, because the voltage, $V_A$, at the common AC ground node, A, may be a function of a voltage drop across the second stage (120), such voltage drop may affect a voltage headroom available to the first stage (110). According to an embodiment of the present disclosure, such voltage headroom may be increased by selecting the transistor T3 of the second stage (120), and transistor T4 (e.g., FIGS. 2, 3A, 3B, 3C), to have low threshold voltages (Vth), such as, for example, equal to about zero volts. As known to a person skilled in the art, intrinsic transistor devices have low threshold voltages. In turn, such low threshold voltage may reduce a drain-to-source voltage of the transistor T3, and therefore a voltage across the second stage (120), for an increase of the voltage $V_A$ at the common AC ground node, A.

Figure 5:
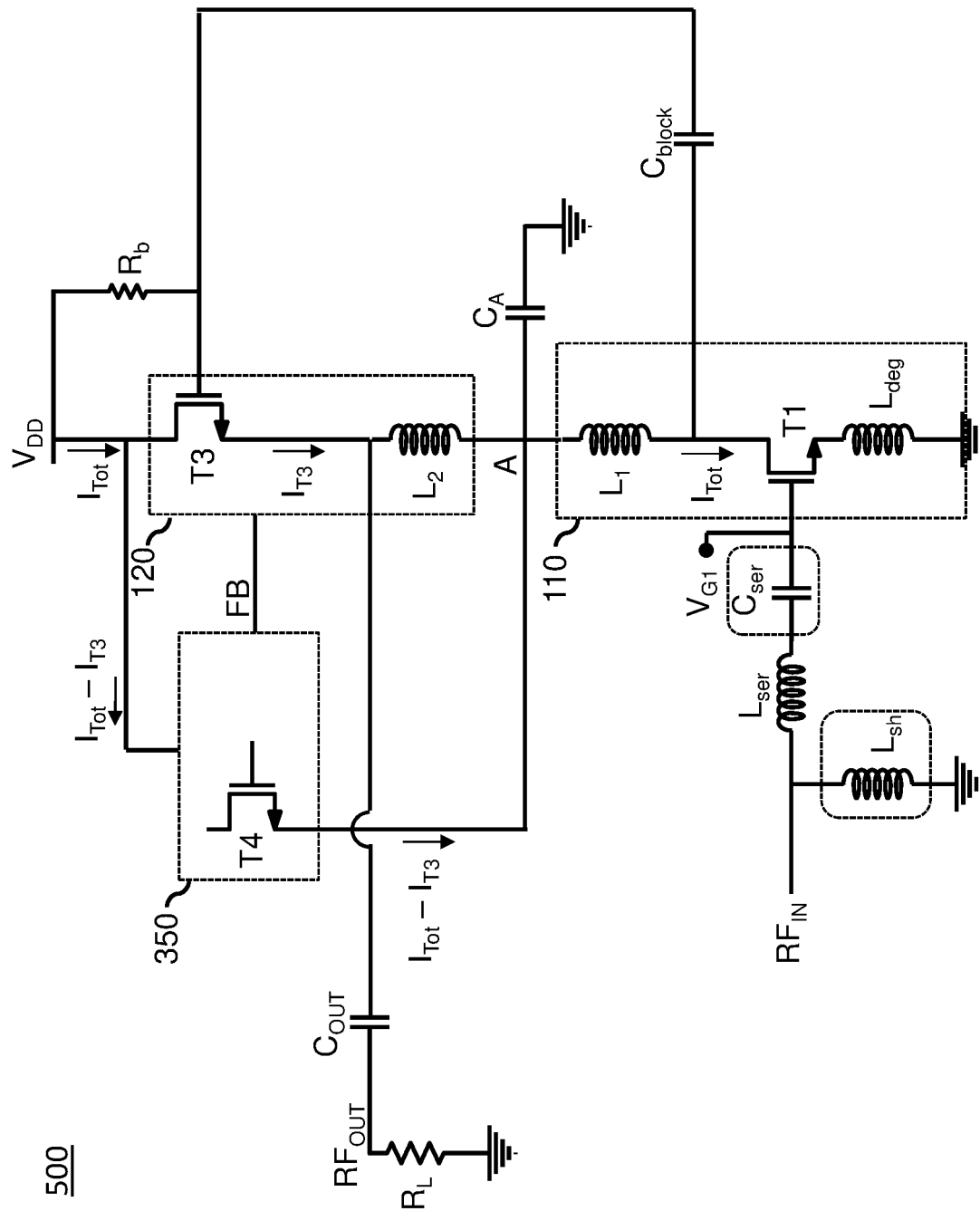
FIG. 5 shows an exemplary embodiment according to the present disclosure based on the configuration shown in FIG. 3B.

As described above, the first amplification stage (e.g., 110) may include a common-source amplifier circuit. FIG. 5 shows a stacked multi-stage LNA (500) according to an exemplary embodiment of the present disclosure based on the configuration (300B) shown in FIG. 3B, with the difference that the first stage (110) of the configuration (500) does not include cascode transistors (e.g., T2 of FIG. 3B). Principle of operation of the stacked multi-stage LNA (500) is same as the configuration (300B) described above with reference to FIG. 3B. To reiterate, all embodiments of the stacked multi-stage LNA configurations according to the present disclosure include a first stage common-source amplifier (e.g., 110) and a second stage common-drain amplifier (e.g. 120). In some configurations, the first stage common-source amplifier may be coupled to one or more common-gate amplifiers (e.g., T2, ..., etc.) arranged as cascodes.

Figure 6:
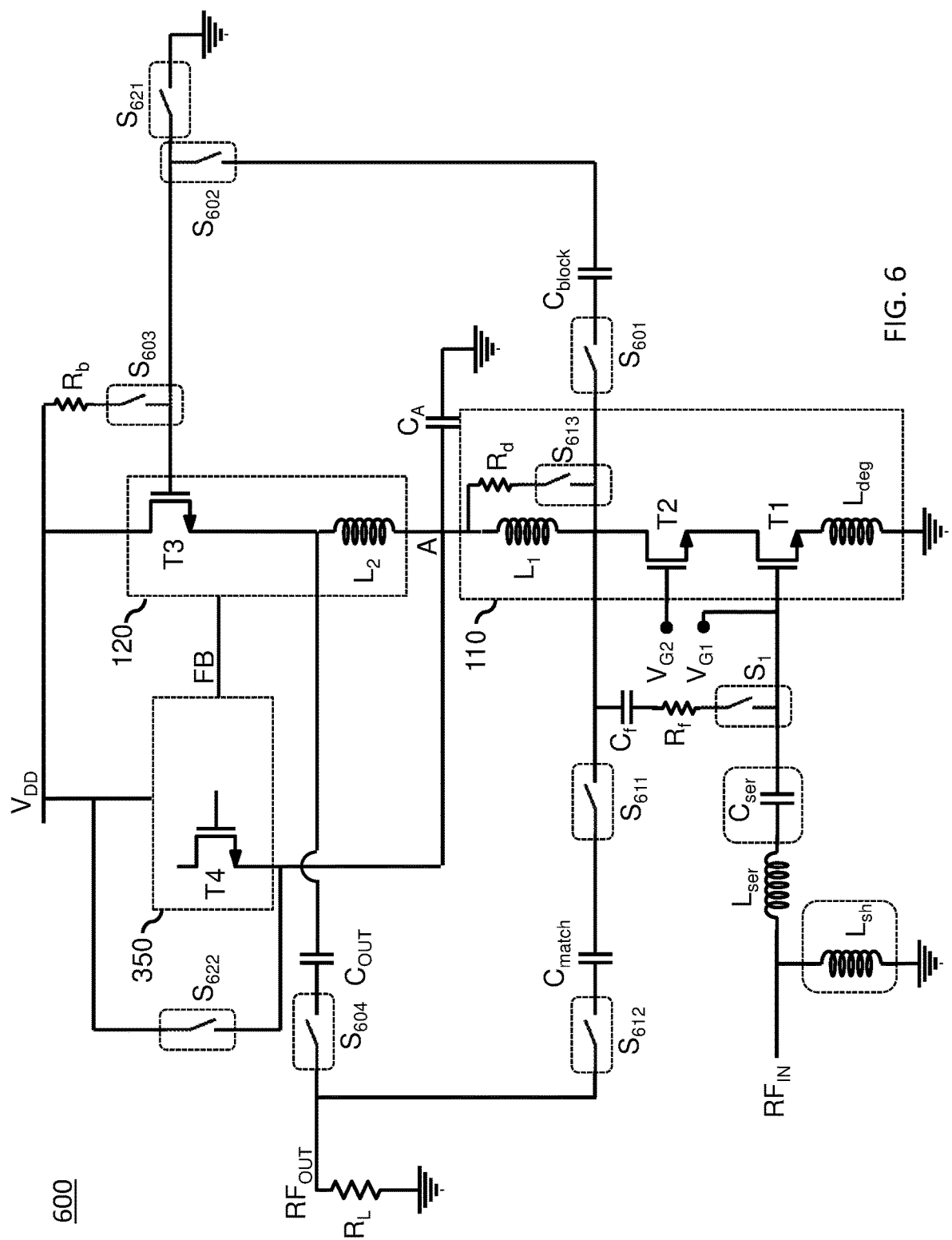
FIG. 6 shows a simplified schematic of a switchable multi-mode low noise amplifier (LNA) according to an embodiment of the present disclosure based on the configuration of FIG. 3B.

FIG. 6 shows a simplified schematic of a switchable multi-mode low noise amplifier (LNA, 600) according to an embodiment of the present disclosure based on the configuration of FIG. 3B. As can be seen in FIG. 6, the configuration (600) is based on the configuration (300B) described above with reference to FIG. 3B, further including a plurality of switches (e.g., Sk) that allow to selectively switch in and out portions of the circuit according to a mode of operation of the switchable LNA (600). Accordingly, different modes of operation of the switchable LNA (600) may be selected in view of different performance metrics. For example, a high gain and wideband mode of operation may be provided by closing switches $S_{601}$ through $S_{604}$, and leaving all other switches open, thereby providing a circuit similar to one described above with reference to FIG. 3B.

On the other hand, a low gain mode and/or a narrowband mode of operation of the switchable LNA (600) may be provided by closing switches $S_{611}$, $S_{612}$, $S_{621}$ and $S_{622}$, and opening switches $S_{601}$ through $S_{604}$. Opening of the switches $S_{601}$ through $S_{604}$, and closing of the switches $S_{621}$ and $S_{622}$, may decouple (e.g., disconnect) the second stage (120) from the first stage (110) and the load $R_L$, while removing any functionality provided by the second stage (120) by removing all DC current flowing through the second stage (120) and through the current splitter circuit (350). Furthermore, closing of the switch $S_{622}$, couples the supply voltage $V_{DD}$ to the first stage (110) via the node A, and closing of the switches $S_{611}$ and $S_{612}$, couples the output of the first stage (110) to the load $R_L$ through a matching capacitor, $C_{match}$. A deQing resistor, $R_d$, with a functionality similar to one described above with reference to FIG. 1A, may be switched in or out via a switch $S_{613}$ for operation according to a low gain and wideband requirement. In the alternative, or in addition, a feedback resistor and capacitor, $R_f$ and $C_f$, with a functionality similar to one described above with reference to FIG. 1B, may be switched in or out via a switch $S_1$ for operation according to a low gain and wideband requirement enabling a wider input match. A person skilled in the art may configure the various switches shown in FIG. 6 according to different performance metrics that may take into account, for example, tradeoffs among gain (flatness), noise figure, linearity, output matching and current distribution among different stages (e.g., 110 and 120).

Figure 7:
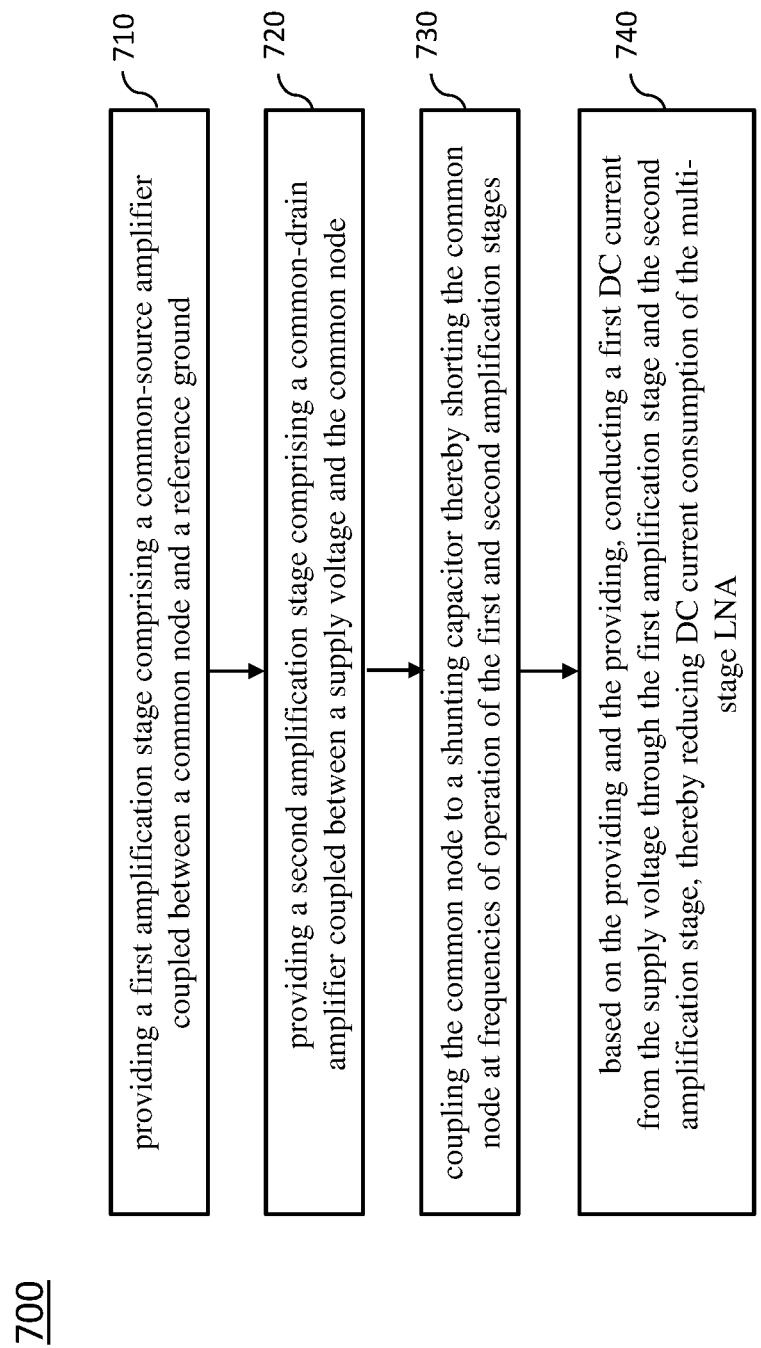
FIG. 7 is a process chart showing various steps of a method according to the present disclosure for reducing DC current consumption in a multi-stage low noise amplifier (LNA).

FIG. 7 is a process chart showing various steps of a method according to the present disclosure for reducing DC current consumption in a multi-stage low noise amplifier (LNA). As can be seen in FIG. 7, such steps comprise: providing a first amplification stage comprising a common-source amplifier coupled between a common node and a reference ground, per step (710); providing a second amplification stage comprising a common-drain amplifier coupled between a supply voltage and the common node, per step (720); coupling the common node to a shunting capacitor thereby shorting the common node at frequencies of operation of the first and second amplification stages, per step (730); and based on the providing and the providing, conducting a first DC current from the supply voltage through the first amplification stage and the second amplification stage, thereby reducing DC current consumption of the multi-stage LNA, per step (740).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A stacked multi-stage low noise amplifier (LNA) circuit, comprising:
    a first amplification stage comprising a common-source amplifier coupled between a common node and a reference ground, the first amplification stage configured to receive an input radio frequency (RF) signal and generate therefrom a first stage amplified RF signal;
    a second amplification stage comprising a common-drain amplifier coupled between a supply voltage and the common node, the second amplification stage configured to receive the first stage amplified RF signal and generate therefrom an output RF signal to a load; and
    a shunting capacitor coupled to the common node, the shunting capacitor configured to short the common node to the reference ground at frequencies of operation of the first and second amplification stages;
    the common-source amplifier comprising an input transistor, the input transistor comprising:
        a gate that is coupled to the input RF signal;
        a source that is coupled to the reference ground through a degeneration inductor; and
        a drain that is coupled to the common node through a first stage load inductor;
    the common-drain amplifier comprising a source-follower transistor, the source-follower transistor comprising:
        a gate that is coupled to the drain of the input transistor to receive the first stage amplified RF signal;
        a drain that is coupled to the supply voltage; and
        a source that is coupled to the common node through a second stage load inductor, the source also being coupled to the load.

2. A stacked multi-stage low noise amplifier (LNA) circuit, comprising:
    a first amplification stage comprising a common-source amplifier coupled between a common node and a reference ground;
    a second amplification stage comprising a common-drain amplifier coupled between a supply voltage and the common node; and
    a shunting capacitor coupled between the common node and a reference ground;
    wherein the common-source amplifier comprises an input transistor, the input transistor comprising:
        a gate that is coupled to an input node;
        a source that is coupled to the reference ground through a degeneration inductor; and
        a drain that is coupled to the common node through a first stage load inductor; and
    wherein the common-drain amplifier comprises a source-follower transistor, the source-follower transistor comprising:
        a gate that is coupled to the drain of the input transistor to receive the first stage amplified RF signal;
        a drain that is coupled to the supply voltage; and
        a source that is coupled to the common node through a second stage load inductor, the source further coupled to the load to output an output RF signal.

3. The stacked multi-stage LNA circuit of claim 2, wherein:
    a conduction path of a first DC current from the supply voltage through the stacked multi-stage LNA includes the common-drain amplifier, the second stage load inductor, the common node, the first stage load inductor, and the common source amplifier.

4. The stacked multi-stage LNA circuit of claim 3, further comprising:
    a current splitter circuit coupled between the supply voltage and the common node, the current splitter circuit configured to provide a conduction path of a second DC current from the supply voltage through the first stage load inductor and the common source amplifier.

5. The stacked multi-stage LNA circuit of claim 4, wherein:
    the conduction path of the second DC current excludes the common-drain amplifier and the second stage load inductor.

6. The stacked multi-stage LNA circuit of claim 4, wherein:
    the current splitter circuit comprises a feedback loop that is configured to sense a current or a voltage at a node of the second amplification stage to control the first DC current or the second DC current.

7. The stacked multi-stage LNA circuit of claim 4, wherein:
    the current splitter circuit comprises a feedback loop that is configured to sense a voltage at the common node to control the first DC current.

8. The stacked multi-stage LNA circuit of claim 7, wherein:
    current splitter circuit comprises a replica circuit of the common-drain amplifier that is coupled at an output of the replica circuit to a reference current source, the reference current source establishing a current through the replica circuit, and
    the feedback loop forces the voltage at the common node to be equal to a voltage at the output of the replica circuit.

9. The stacked multi-stage LNA circuit of claim 8, wherein:
    the feedback loop comprises an operational amplifier coupled to a pass transistor,
    the operational amplifier comprising:
        a positive input that is coupled to the output of the replica circuit;
        a negative input that is coupled to the common node and to a source of the pass transistor; and
        an output coupled to a gate of the pass transistor, and
    a drain of the pass transistor is coupled to the supply voltage, so that the conduction path of the second DC current further includes the pass transistor.

10. The stacked multi-stage LNA circuit of claim 8, wherein:
the replica circuit is a reduced scaled version of the common-drain amplifier by a factor equal to 1/N, and the first DC current is a factor N larger than the reference current.

11. The stacked multi-stage LNA circuit of claim 9, wherein:
the source-follower transistor of the common-drain amplifier and the pass transistor are intrinsic transistor devices.

12. The stacked multi-stage LNA circuit of claim 2, wherein:
the first amplification stage further comprises one or more common-gate amplifiers in series connection with the common-source amplifier, the one or more common-gate amplifiers configured for operation as cascodes.

13. The stacked multi-stage LNA circuit of claim 12, further comprising:
a gate biasing circuit configured to generate respective one or more gate biasing voltages to gates of the one or more common-gate amplifiers,
wherein
the gate biasing circuit comprises a feedback loop that is configured to sense a voltage at the common node to generate at least one gate biasing voltage to a gate of a respective common-gate amplifier of the one or more common-gate amplifiers that tracks the voltage at the common node.

14. The stacked multi-stage LNA circuit of claim 13, wherein:
the feedback loop comprises an operational amplifier coupled to the respective common-gate amplifier,
the operational amplifier comprising:
a positive input that is coupled to a node of a resistive voltage divider, the resistive voltage divider coupled between the common node and the reference ground;
a negative input that is coupled to a source of the respective common-gate amplifier; and
an output coupled to the gate of the respective common-gate amplifier.

15. The stacked multi-stage LNA circuit of claim 1, further comprising:
a plurality of switches coupled to the first and second amplification stage, the plurality of switches configured to selectively perform any one, or a combination, of the following:
i) couple or decouple the first amplification stage to or from the second amplification stage,
ii) couple or decouple an output of the second amplification stage to or from the load,
iii) couple or decouple an output of the first amplification stage to or from the load,
iv) enable or disable a current flow through the second amplification stage,
v) couple or decouple a load de-Qing resistor to or from an output of the first amplification stage, or
vi) couple or decouple a feedback resistor between an input of the first amplification stage and the output of the first amplification stage.

16. The stacked multi-stage LNA circuit of claim 1, wherein:
the common-source amplifier and the common-drain amplifier comprise metal-oxide-semiconductor (MOS) field effect transistors (FETs), or complementary metal-oxide-semiconductor (CMOS) field effect transistors (FETs).

17. The stacked multi-stage LNA circuit of claim 16, wherein:
said transistors are fabricated using one of: a) silicon-on-insulator (SOI) technology, and b) silicon-on-sapphire technology (SOS).

18. An electronic module comprising the stacked multi-stage LNA circuit of claim 1.

19. An electronic system, comprising:
the electronic module of claim 18,
wherein the electronic system is selected from a group consisting of: a) a television, b) a cellular telephone, c) a personal computer, d) a workstation, e) a radio, f) a video player, g) an audio player, h) a vehicle, and i) a medical device.

20. A method for reducing DC current consumption in a multi-stage low noise amplifier (LNA), the method comprising:
providing a first amplification stage comprising a common-source amplifier coupled between a common node and a reference ground;
providing a second amplification stage comprising a common-drain amplifier coupled between a supply voltage and the common node;
coupling the common node to a shunting capacitor thereby shorting the common node at frequencies of operation of the first and second amplification stages; and
based on the providing and the providing, conducting a first DC current from the supply voltage through the first amplification stage and the second amplification stage, thereby reducing DC current consumption of the multi-stage LNA;
coupling a transistor between the supply voltage and the common node, thereby conducting a second DC current from the supply voltage through the first amplification stage while bypassing the second amplification stage;
using a feedback loop for sensing a voltage at the common node and forcing said voltage to a constant level; and
based on the using, maintaining the first DC current constant.

21. The stacked multi-stage LNA circuit of claim 2, further comprising:
a plurality of switches coupled to the first and second amplification stage, the plurality of switches configured to selectively perform any one, or a combination, of the following:
i) couple or decouple the first amplification stage to or from the second amplification stage,
ii) couple or decouple an output of the second amplification stage to or from the load,
iii) couple or decouple an output of the first amplification stage to or from the load,
iv) enable or disable a current flow through the second amplification stage,
v) couple or decouple a load de-Qing resistor to or from an output of the first amplification stage, or
vi) couple or decouple a feedback resistor between an input of the first amplification stage and the output of the first amplification stage.

\* \* \* \* \*